US008049500B2

(12) United States Patent
Griswold et al.

(10) Patent No.: US 8,049,500 B2
(45) Date of Patent: Nov. 1, 2011

(54) DYNAMICALLY SELECTIVELY CONFIGURING WIRELESS TRANSMITTER ASSOCIATED WITH MRI DETECTOR COIL

(75) Inventors: Mark A. Griswold, Shaker Heights, OH (US); Matthew J. Riffe, Cincinnati, OH (US); Jeremiah A. Heilman, University Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 357 days.

(21) Appl. No.: 12/417,703

(22) Filed: Apr. 3, 2009

(65) Prior Publication Data

US 2010/0253331 A1    Oct. 7, 2010

(51) Int. Cl.
*G01V 3/00* (2006.01)
(52) U.S. Cl. .................. 324/318; 324/322
(58) Field of Classification Search .......... 324/318, 324/322
See application file for complete search history.

(56) References Cited

U.S. PATENT DOCUMENTS 5,666,055 A * 9/1997 Jones et al. .................. 324/318
7,123,009 B1  10/2006 Scott
7,323,876 B2 * 1/2008 Den Boef .................... 324/322
7,619,415 B2 * 11/2009 Nakabayashi ............... 324/318
7,750,630 B2 * 7/2010 Van Helvoort et al. ....... 324/307

OTHER PUBLICATIONS

Wei, Juan et al. "Digital Wireless Transmission for MRI Signals" Proceedings from the 15th Annual Meeting of the International Society of Magnetic Resonance in Medicine, Berlin, Germany, Abstract #1001, (2007).
Shen, Gary et al "Signle Fiber Optical Fiber Transmission for Multi-Channel MRI Using FDM Method" Proceedings of the 16th Annual Meeting of the International Society of Magnetic Resonance in Medicine, Toronto, Canada, Abstract #0683, (2008).

* cited by examiner

*Primary Examiner* — Louis Arana
(74) *Attorney, Agent, or Firm* — Kraguljac & Kalnay, LLC (57) ABSTRACT

Systems, methods, and other embodiments associated with dynamically selectively configuring wireless transmitters associated with MRI detector coils are described. One example apparatus includes a detector coil to receive an NMR signal. The apparatus includes a dynamically configurable transmitter to transmit an RF transmission according to a configurable set of transmission parameters. The RF transmission is based on the NMR signal received by the MRI detector coil. The apparatus includes a tuning logic that cycles between an active state and a passive state under the control of a tuning program. While in the passive state, the tuning logic is to generate substantially no RF that could interfere with receiving the NMR signal at the MRI detector coil. While in the active state, the tuning logic is to configure the dynamically configurable transmitter to transmit according to the set of transmission parameters.

24 Claims, 6 Drawing Sheets

DYNAMICALLY SELECTIVELY CONFIGURING WIRELESS TRANSMITTER ASSOCIATED WITH MRI DETECTOR COIL

BACKGROUND

The diagnostic performance of a magnetic resonance imaging (MRI) apparatus varies directly with the number of detectors used to detect the available nuclear magnetic resonance (NMR) signals emanating from an object. Yet conventional systems have a finite limit on the number of detectors. The finite limit is related to cabling connections between detectors and processing apparatus (e.g., scanner, computer). Consider that conventional systems with multiple detectors may include several miles of cabling connections. This increases the cost, space requirements, and weight of an MRI apparatus. This also produces the limitation concerning the number of detectors possible in conventional systems.

Since cabling connections between detectors and other MRI apparatus elements are a limiting factor, attempts have been made to connect detectors to other MRI apparatus elements using wireless techniques. The techniques include, for example, time multiplexed optical transmission, digital wireless transmission, and so on. However, time multiplexed optical transmission still experiences a limit on the maximum number of detectors that can be supported. Additionally, digital wireless transmission solutions have suffered from bandwidth limitations, have required complex digital conversion equipment, and have required an unacceptable amount of power. Therefore, research into additional wireless techniques for connecting detector coils to MRI apparatus elements is ongoing.

Recall that MRI apparatus use coil sensors to detect NMR signals emanating from an object. Recall also that these NMR signals are relatively weak compared to RF noise in a general environment. Therefore, MRI apparatus are generally located in rooms that are shielded by a Faraday cage. While the Faraday cage can limit the intrusion of RF noise from outside the room, it cannot address RF noise generated inside the room, in the MRI environment. Clearly the detector coils must be located in the room because the relatively weak NMR signals cannot escape the room. Therefore, electronics, circuits, cabling, and so on located inside the room have conventionally been shielded to limit the RF noise they can introduce into the room. However, this shielding adds yet more mass, volume, and expense to an MRI apparatus.

RF signals transmitted wirelessly from a detector coil may be more powerful than NMR signals transmitted from a resonating body. Thus, if RF signals are transmitted while NMR signals are being detected, detecting the NMR signals may be compromised. Therefore, using remote devices like wireless transmitters associated with detector coils has been limited, if even possible at all, because signals and noise associated with remote devices have interfered with detecting the NMR broadcast by the resonating body. To be practical, wireless transmission of signals from a detector coil to an MRI apparatus element must not interfere with the NMR signals being received by a detector coil. Additionally, circuitry to control wireless transmitters must not produce noise that interferes with detecting NMR signals.

Wireless transmitters associated with detector coils seem to provide a path to overcome mass, volume, and expense issues associated with cabling connections. And yet wireless transmitters need to be controlled by circuits that traditionally have introduced unacceptable RF noise into the room. Parameters that need to be controlled for wireless transmitters associated with detector coils include, for example, channel identification, channel spacing, power settings, and so on. Conventionally, a tuning logic may have configured a typical transmitter associated with a remote magnetic coil sensor. But this tuning logic may have produced electromagnetic (e.g., RF) noise while controlling the transmitter. This electromagnetic noise may have interfered with detecting relatively weaker NMR signals.

Previous efforts to mitigate these issues have included microcontroller governed MR devices. Conventional microcontrollers have been used to control the frequency of a multiplexing system and controlled digital transmissions. These conventional microcontroller based systems used volatile memory and thus required direct programming at each power up. This may have created configuration and interference issues. The volatile memory and/or microcontroller may have been continuously clocked and this may have continually produced RF noise. Another conventional microcontroller based system included an implantable detector tuning control that controlled a single detector but did not mitigate the issues described above.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

An MRI apparatus may have multiple detector coils. A detector coil may include a wireless transmitter. The wireless transmitter can transmit signals associated with NMR signals received by the detector coil to another MRI apparatus element. For example, a wireless transmitter can transmit to a receiver associated with an MRI scanner.

NMR signals are received periodically in response to a pulse sequence. Therefore, during an MRI session, there may be periods of time when RF noise in the MRI environment is unacceptable and there may be periods of time when RF noise can be tolerated. Example systems and methods employ the periods of time when RF noise can be tolerated to configure wireless transmitters associated with detector coils.

If an MRI apparatus only had a single detector coil, there would be little chance of interference between transmissions from a single transmitter associated with the single detector coil. Similarly, if an MRI apparatus only had a single detector coil and a single transmitter then there would only need to be a single receiver. However, if there are two detector coils, and if each detector coil has its own wireless transmitter, then there is a chance that a transmission from a first transmitter could interfere with a transmission from a second transmitter. Well known techniques (e.g., time division multiplexing) could resolve this potential interference between two transmitters. However, these techniques may not scale sufficiently well to be relevant to MRI apparatus that include multiple (e.g., 256) detectors, especially when an MRI apparatus seeks to produce an image as quickly as possible, perhaps even in real-time. Scaling issues could include burdensome configuration.

Interference could be reduced between multiple transmitters by configuring each transmitter to transmit on different single frequencies and by using a single receiver on a single frequency for each transmitter. However, the number of receivers, and the cost, mass, and volume associated with a large number of receivers would quickly make this approach infeasible. Additionally, manually configuring each transmitter to transmit on a specific frequency could be burdensome. However, one skilled in the art will appreciate that in some embodiments multiple receivers may be used in addition to or alternatively to a broadband receiver.

Recall that the performance of an MRI apparatus varies directly with the number of detector coils. Consider that different imaging techniques may use different detector coils and/or sets of detector coils. For example, an MRI apparatus may be used to acquire an image of a head, then of a knee, then of a heart. Each of these techniques may use different sets of detector coils. If these detector coils are configured with wireless transmitters, then manually configuring these detector coils so that they do not interfere with each other or selecting sets of detector coils that will not interfere with each other could be a challenge. Also, configuring multiple receivers could be a challenge. Therefore, example systems and methods may employ a single broadband receiver configured to receive signals of different frequencies from different transmitters associated with different detector coils.

Example systems and methods facilitate dynamically programming a transmitter associated with a detector coil to operate using a configurable set of parameters (e.g., frequency, power) to reduce interference between transmitters and thus to increase the number of detector coils that can be used by an MRI apparatus. Since RF transmitters associated with the detector coils transmit wirelessly to a broadband receiver(s) associated with the MRI apparatus, mass, volume, and expense issues associated with cabling connections between detectors and the receiver(s) are mitigated. Additionally, mass, volume, and expense issues associated with multiple receivers are mitigated by using a single or a small number of broadband receivers. Example systems and methods also address configuration issues associated with transmitting multiple signals from multiple transmitters associated with multiple detector coils.

Recall that conventional control circuitry may have introduced RF noise into the MRI environment. The RF noise and/or other electrical noise may have been generated simply by clocking the control circuitry. Therefore, example systems and methods are configured to not produce relevant RF noise during the time when NMR signals are being received by detector coils. In one example, control circuitry and/or control logic dynamically and selectively program a transmitter to a specific frequency and/or power. The selective programming can occur during times when RF noise is acceptable in the MRI environment. The periodic nature of NMR signal production in response to a pulse sequence provides periodic opportunities to tune a transmitter.

Therefore, in one embodiment, a tuning logic associated with a transmitter associated with a detection coil is configured to cycle between an active state and a passive state. While in the passive state, the tuning logic may generate substantially no electromagnetic noise that interferes with receiving an NMR signal. The tuning logic passive state may be, for example, a power off state, a sleep state, an inactive state, a wait state, a non-clocked state, and so on. The tuning logic may cycle into the passive state during a period when NMR signals are expected. In one embodiment, the tuning logic is not even clocked during the passive state.

The tuning logic may cycle into an active state to adjust the transmitter. The active state may be, for example, a power on state, an awake state, a clocked state, and so on. While in the active state, the tuning logic may configure the transmitter. Rather than clock the tuning logic to cycle between states, where the clocking could itself produce undesirable RF noise, the tuning logic may simply power down. Then, the tuning logic may be powered up again at an appropriate time during a pulse sequence. Since the tuning logic is being powered up and powered down, the tuning logic will be configured to perform its tuning actions after a configurable, programmable period of time after a power up. In one embodiment, the tuning logic may include and/or be associated with a non-volatile memory that provides instructions for the tuning logic. The tuning logic may be, for example, a microprocessor that receives instructions from a non-volatile memory at startup. The instructions in the non-volatile memory may be provided automatically at power up. Since the instructions are in the non-volatile memory, the instructions can be available on each power up of the tuning logic. Therefore, the tuning logic can be turned off and on as desired. One skilled in the art will appreciate that the tuning logic may take different forms and may receive instructions from different locations.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"User", as used herein, includes but is not limited to one or more persons, software, computers or other devices, or combinations of these.

Figure 1:
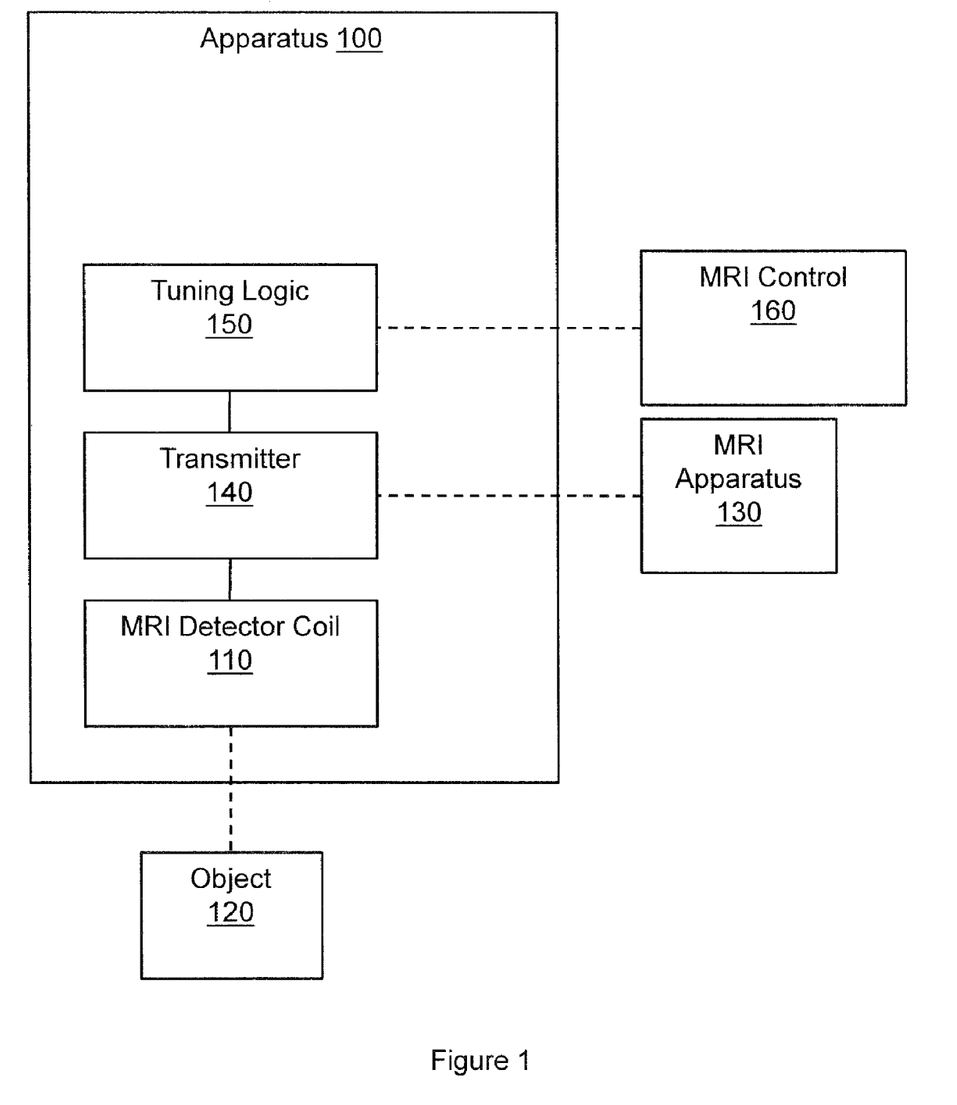
FIG. 1 illustrates an example apparatus associated with dynamically selectively configuring wireless transmitters associated with MRI detector coils.

FIG. 1 illustrates an apparatus 100 associated with dynamically selectively configuring a wireless transmitter associated with an MRI detect coil. Apparatus 100 includes a magnetic resonance imaging (MRI) detector coil 110. Coil 110 is configured to receive a nuclear magnetic resonance (NMR) signal from an object 120. Object 120 will have been subjected to radio frequency (RF) energy applied by an MRI apparatus 130 according to an MRI pulse sequence. The pulse sequence will lead to the object 120 periodically transmitting NMR signals. During these time periods RF noise is intolerable. The pulse sequence will also include periods of time during which RF noise is tolerable. In one embodiment apparatus 100 may not be physically and/or electrically connected to the MRI apparatus 130 but rather only communicates with MRI apparatus 130 by wireless communications.

Apparatus 100 also includes a dynamically configurable transmitter 140. Transmitter 140 is configured to transmit an RF transmission to the MRI apparatus 130. Transmitter 140 can be configured according to a configurable set of transmission parameters. The transmitter 140 is to transmit an RF signal that is based on the NMR signal received by the MRI detector coil 110. Rather than transmit the signal down a wire to the MRI apparatus 130, the signal may be sent wirelessly.

To control when and how the RF signal is transmitted by transmitter 140, apparatus 100 includes a tuning logic 150. Tuning logic 150 is configured to cycle between an active state and a passive state under the control of a tuning program. In one embodiment, the tuning program may be configured as a function of the MRI pulse sequence so that RF tolerant time periods can be exploited to tune transmitter 140 and to transmit the signals based on the NMR signal received from the object 120. The tuning program may also be configured as a function of the MRI pulse sequence so that no RF noise is generated during RF intolerant time periods. In one embodiment the passive state may be a powered-off state and the active state may be a powered-on state. In one embodiment, tuning logic 150 may receive an input signal. The input signal may be used by the tuning logic 150 for the synthesis of a wireless transmission carrier frequency. In one example, the input signal may be provided by an MRI control 160. The MRI control 160 may provide, for example, an ultra-stable 10 MHz master clock, a trigger, and so on.

When tuning logic 150 is in its passive state, it is to generate substantially no RF that could interfere with receiving the NMR signal at the MRI detector coil 110. One skilled in the art will appreciate that when the detector coil 110 is receiving NMR signal, that signal will be provided to a consumer. When tuning logic 150 is in its active state, it is to configure the dynamically configurable transmitter 140 so that transmitter 140 will transmit according to the set of transmission parameters. The set of transmission parameters may include, for example, frequency, amplitude, and power. Values for members of the set of transmission parameters may be selected based, at least in part, on a startup parameter available to the apparatus. As described below in connection with FIG. 3, a startup parameter may be provided by an external timing circuit.

In one embodiment, the tuning logic 150 is configured to enter the passive state before the NMR signal is received by the MRI detector coil and is configured to enter the active state after the NMR signal is received by the MRI detector coil. This can be achieved by synchronizing state changes with anticipated portions of a pulse sequence. The tuning logic 150 may be, for example, a microprocessor, a microcontroller, an ASIC, and so on. The tuning logic 150 may be configured to control different properties of the apparatus 100 and/or the transmitter 140. For example, the tuning logic 150 may control carrier frequency synthesis for the transmitter 140, carrier frequency power output of the transmitter 140, apparatus 100 power consumption, battery management for the apparatus 100, channel synchronization for the transmitter 140, and so on. One skilled in the art will appreciate that tuning logic 150 may be configured to control multiple transmitters.

Tuning logic 150 may not directly control the transmitter 140, but may instead control a circuit, electronic component, logic, and so on, that in turn controls the transmitter 140. Thus, tuning logic 150 may control a digital device that controls the frequency at which the transmitter 140 is to transmit.

Figure 2:
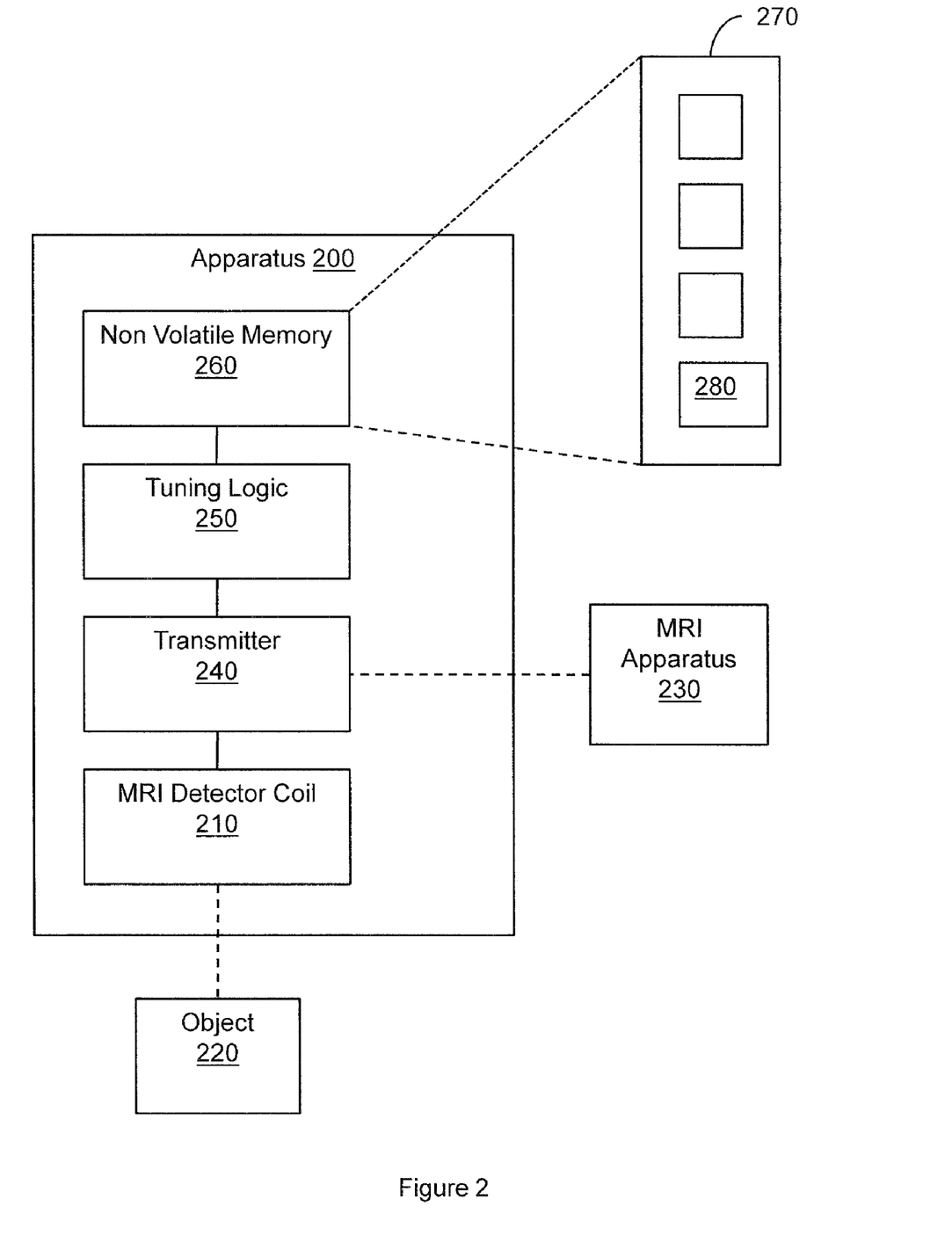
FIG. 2 illustrates an example apparatus associated with dynamically selectively configuring wireless transmitters associated with MRI detector coils.

FIG. 2 illustrates an apparatus 200 associated with dynamically selectively configuring a wireless transmitter associated with an MRI detect coil. Apparatus 200 includes many of the same elements as apparatus 100 (FIG. 1). For example, apparatus 200 includes an MRI detector coil 210, a transmitter 240, and a tuning logic 250. Apparatus 200 interacts with an MRI apparatus 230 and an object 220.

Apparatus 200 includes a non-volatile memory 260. Non-volatile memory 260 stores a tuning program. In one embodiment, the tuning program may be loaded into non-volatile memory when apparatus 200 is built. In another embodiment, the tuning program may be a member 280 selected from a set of available tuning programs 270. The tuning program 280 may be uploaded to apparatus 200 using various approaches. For example, the tuning program 280 may be sent to apparatus 200 by a cable, by a wireless transmission, and so on. Different tuning programs may be available because different MRI apparatus or different MRI sessions may use different pulse sequences that produce RF tolerant and RF intolerant time periods of different lengths at different times in different sequences. Since apparatus 200 has a non-volatile memory 260, apparatus 200 can be powered on and/or off as desired, potentially in synchronization with a pulse sequence. While powered off, these components will not produce RF that interferes with NMR signals. When powered back on, the non-volatile memory 260 has instructions to control tuning logic 250 to tune transmitter 240. This mitigates configuration, power, and interference issues associated with conventional systems.

Figure 3:
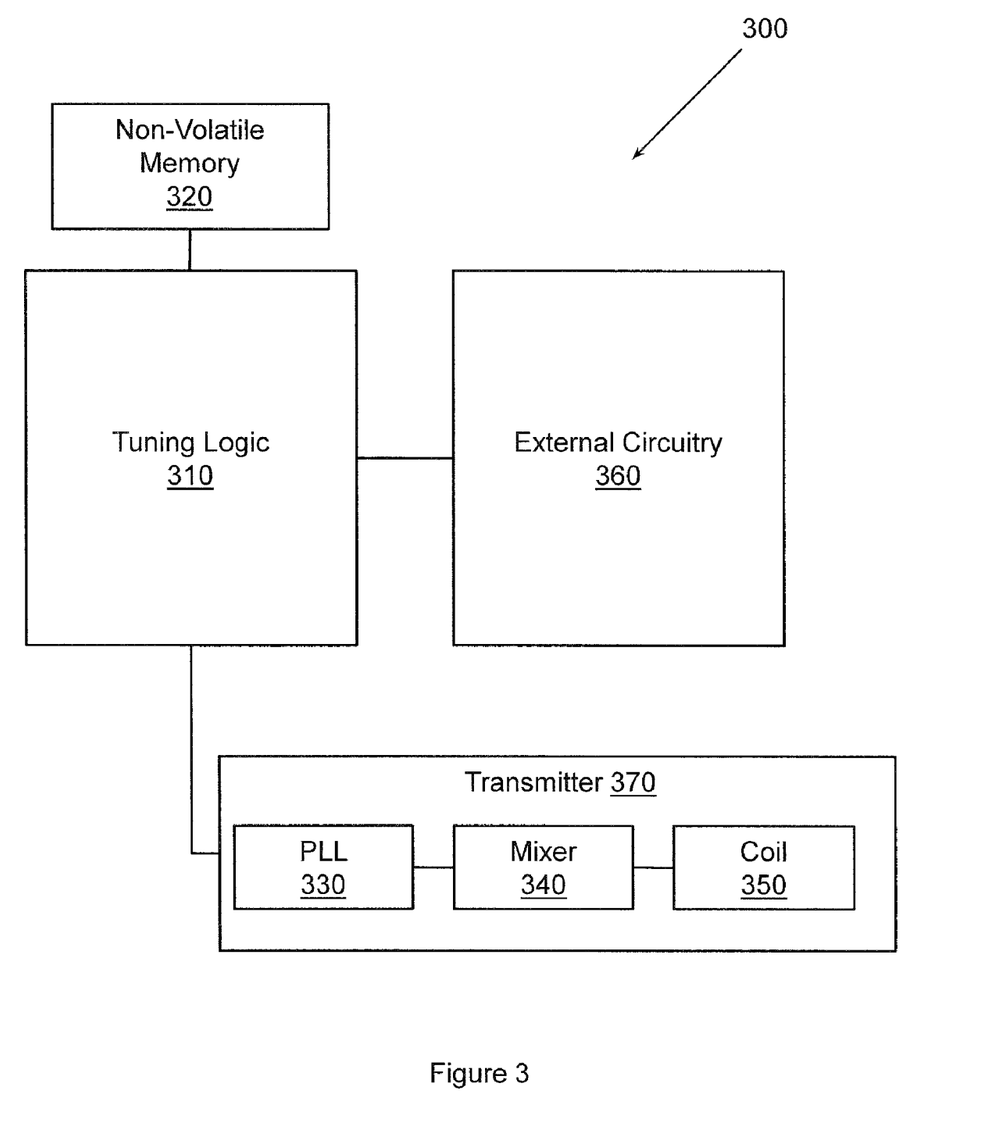
FIG. 3 illustrates an example apparatus associated with dynamically selectively configuring wireless transmitters associated with MRI detector coils.

FIG. 3 illustrates an apparatus 300 associated with dynamically selectively configuring a wireless transmitter associated with an MRI detect coil. Apparatus 300 includes a tuning logic 310 that is operably connected to a non-volatile memory 320 and to external circuitry 360. In one embodiment, the external circuitry 360 can provide a startup parameter to tuning logic 310. In another embodiment, the external circuitry 360 may provide information from which a startup parameter can be determined. For example, the startup parameter may be computed as a function of a time interval between circuitry 360 being powered on and circuitry 360 achieving a threshold voltage.

While external circuitry 360 is illustrated being directly connected to tuning logic 310, one skilled in the art will appreciate that external circuitry 360 may not be physically connected to tuning logic 310 and yet may still provide either a startup parameter and/or information from which a startup parameter may be computed. For example, the startup parameter may be encoded in RF energy produced as a result of a pulse sequence, may be broadcast to the tuning logic 310, and so on. Thus, in different examples the tuning logic 310 may be programmed through direct in-circuit programming, component-based analog programming, component-based digital programming, wireless programming, and so on.

Tuning logic 310 is configured to tune transmitter 370. Transmitter 370 may include different components. One skilled in the art will appreciate that there are different configurations for transmitters and that different configurations will receive different control signals from a tuning logic. In the example illustrated, transmitter 370 may include an amplifier, a voltage-controlled oscillator, a mixer 340, a voltage regulator, and a phased locked loop circuit 330. The mixer 340 and the phase locked loop circuit 330 may control coil 350 to transmit at a desired frequency.

In one example, the tuning logic 310 may be a microcontroller that is operably connected to the transmitter 370. The microcontroller will control the phased lock loop circuit 330 to generate a desired control frequency and thus control the transmitter 370 to transmit at a desired transmission frequency as a function of the control frequency. While the phase locked loop (PLL) 330 and the mixer 340 are illustrated as parts of transmitter 370, one skilled in the art will appreciate that these components may be located outside the transmitter.

Different coil detector transmitter configurations may be associated with different external circuitry 360. Thus, different coil detector transmitter configurations may be configured in different ways based on the external circuitry 360. In this way, otherwise identical coil detector transmitter configurations may be individually, dynamically programmed to transmit using different parameters (e.g., frequency). This facilitates using multiple detector coil transmitter configurations with a single MRI apparatus.

In one embodiment, a single wireless receive-only channel based on analog amplitude modulation (AM) frequency multiplexing may be employed. The MR receiver element may be tuned to a desired frequency (e.g., 63.6 MHz). One skilled in the art will appreciate that frequency modulation (FM), and other analog signal transmission techniques may be employed. The receive-only channel may be attached to a transmitter module. The transmitter module may include, for example, a PLL and a voltage controlled oscillator (VCO) to generate a unique carrier signal. A microprocessor may control these devices. For example, the microprocessor may control the frequency of the wireless carrier signal. External components define a specific RC time constant that can determine a predefined carrier frequency.

Figure 4:
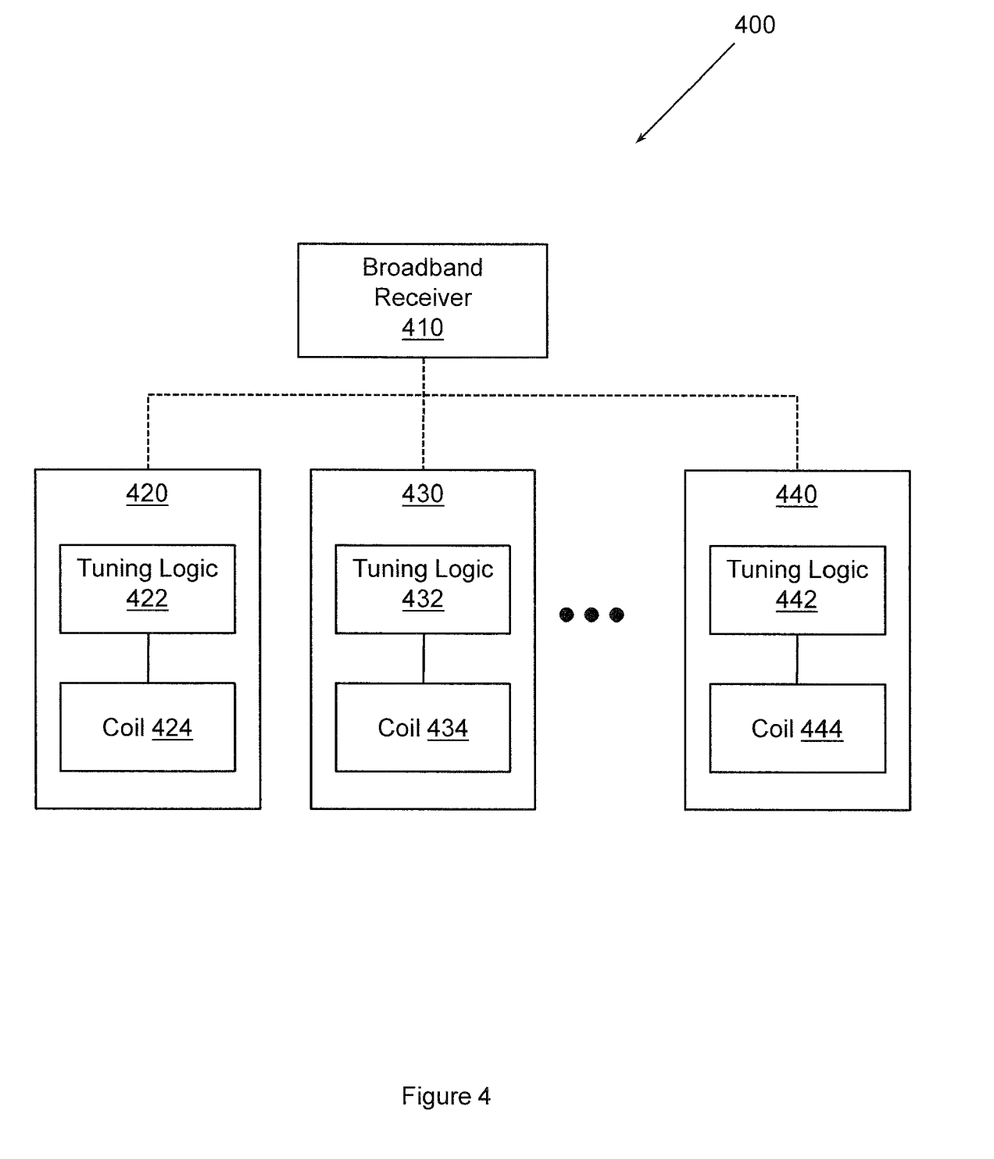
FIG. 4 illustrates an example system associated with dynamically selectively configuring wireless transmitters associated with MRI detector coils.

FIG. 4 illustrates a system 400 associated with dynamically selectively configuring a wireless transmitter associated with an MRI detect coil. System 400 includes a single broadband receiver 410 that can receive transmissions from a number of transmitters. While a single broadband receiver 410 is illustrated, one skilled in the art will appreciate that a system may include more than one receiver.

System 400 includes apparatus 420 and 430 through 440. Apparatus 420 and 430 through 440 are examples of detector coil transmitter apparatus that can transmit RF to broadband receiver 410 wirelessly. Apparatus 420 includes a tuning logic 422 and a detector coil 424. Similarly, apparatus 430 includes a tuning logic 432 and a coil 434 and apparatus 440 includes a tuning logic 442 and a coil 444.

Since there is more than one detector coil transmitter apparatus, the different apparatus (420, 430, 440) may be programmed to transmit on different frequencies. In one example, an apparatus may be hard coded at the factory to transmit on a certain frequency. This hard coding may be embedded into the different tuning logics. In another example, an apparatus may be dynamically configured at power up time by external circuitry physically connected to a tuning logic. In yet another example, an apparatus may be dynamically configured at power up time by a broadcast configuration signal. Regardless of the approach, the different apparatus can be configured to transmit at different frequencies. The apparatus can be configured without generating RF that interferes with detector coils receiving NMR signals.

Figure 5:
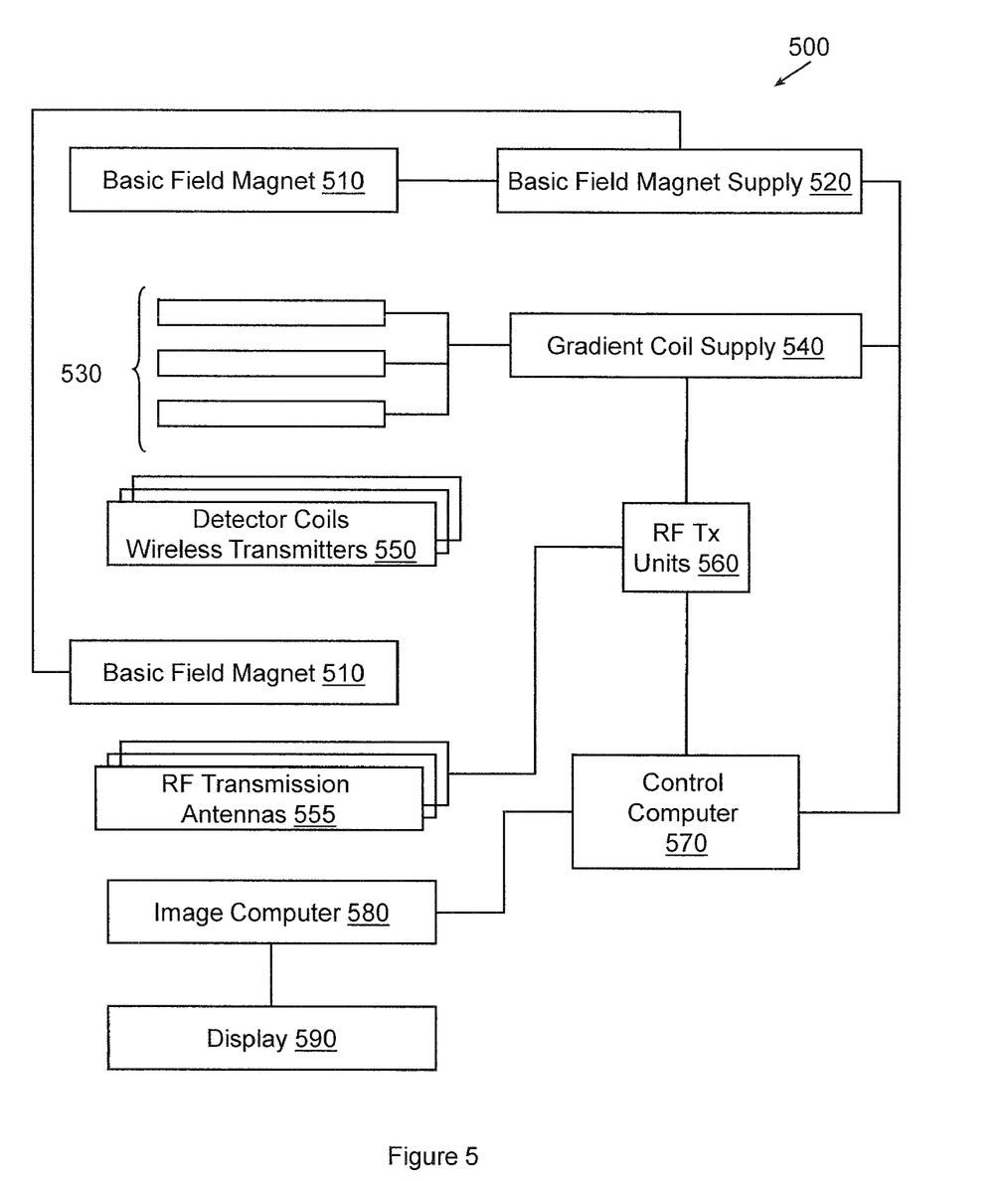
FIG. 5 illustrates an example MRI system configured to dynamically selectively configure wireless transmitters associated with MRI detector coils.

FIG. 5 illustrates an MRI apparatus 500. The apparatus 500 includes a basic field magnet(s) 510 and a basic field magnet supply 520. One skilled in the art will appreciate that in some embodiments (e.g., superconducting field magnet 510), that the basic field magnet supply 520 may not be present. Ideally, the basic field magnets 510 would produce a uniform $B_o$ field. However, in practice, the $B_o$ field may not be uniform, and may vary over an object being imaged by the MRI system 500. MRI system 500 may include gradient coils 530 configured to emit gradient magnetic fields like $G_S$, $G_P$ and $G_R$. The gradient coils 530 may be controlled, at least in part, by a gradient coils supply 540. In some examples, the timing, strength, and orientation of the gradient magnetic fields may be controlled, and thus selectively adapted during an MRI procedure.

MRI system 500 may include a set of apparatus 550 that include both detector coils and wireless transmitters as described above. The apparatus 550 are configured to receive magnetic resonance signals from a resonating object to which RF pulses are directed. The apparatus 550 are also configured to transmit, wirelessly, an RF signal related to the detected NMR signals to the apparatus 500.

In some examples, how the MR signals are received may be controlled and thus may be selectively adapted during an MRI procedure. Separate RF transmission and reception coils can be employed. The RF transmission antennas 555 may be associated with transmitting RF energy to the object. RF transmission antennas 555 may be controlled, at least in part, by a set of RF transmission units 560. An RF transmission unit 560 may provide a signal to an RF transmission antenna 555.

The gradient coils supply 540 and the RF transmission units 560 may be controlled, at least in part, by a control computer 570. In one example, the control computer 570 may be programmed to control an MRI device as described herein. The magnetic resonance signals received from the RF antennas 550 can be employed to generate an image and thus may be subject to a transformation process like a two dimensional FFT that generates pixilated image data. The transformation can be performed by an image computer 580 or other similar processing device. The image data may then be shown on a display 590. While FIG. 5 illustrates an example MRI system 500 that includes various components connected in various ways, it is to be appreciated that other MRI apparatus may include other components connected in other ways.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 6:
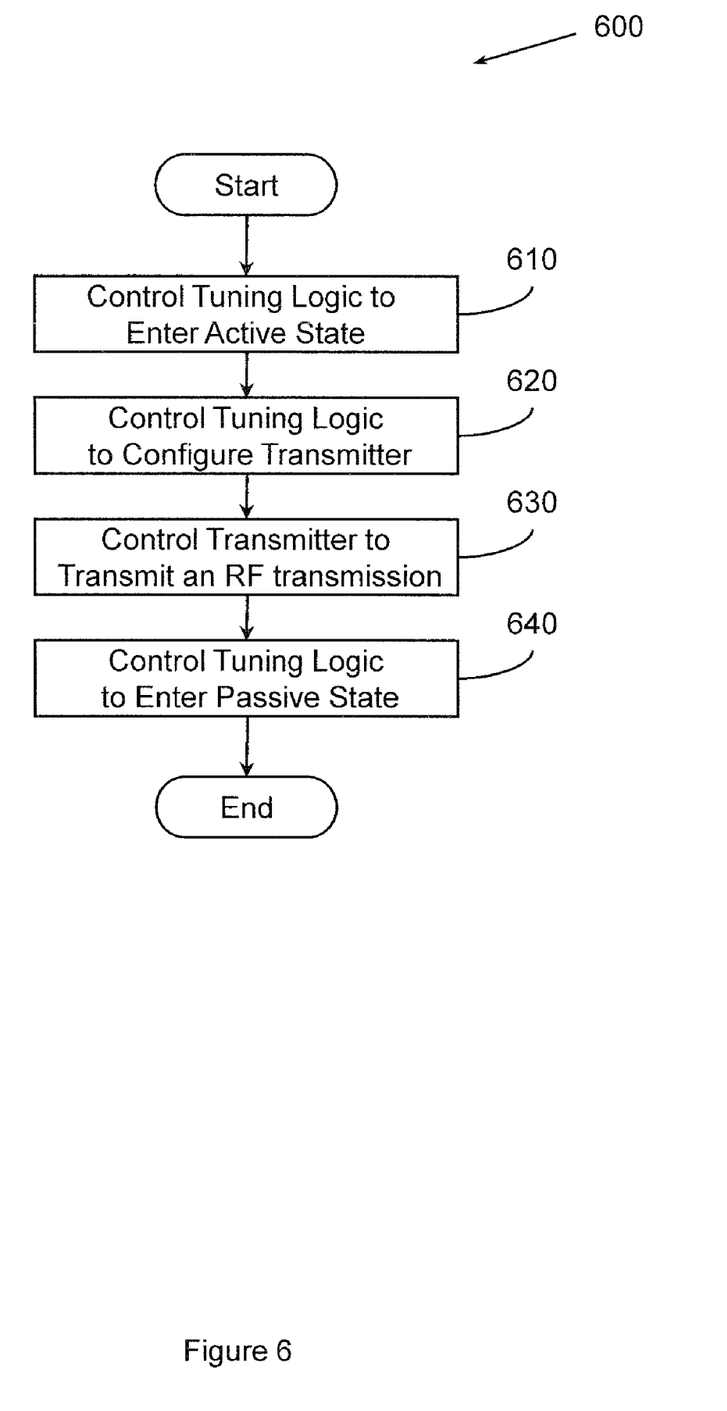
FIG. 6 illustrates an example method associated with dynamically selectively configuring wireless transmitters associated with MRI detector coils.

FIG. 6 illustrates a method 600 associated with dynamically selectively configuring wireless transmitters associated with MRI detector coils. Method 600 may include, at 610, controlling a tuning logic to enter an active state. The tuning logic may be controlled to enter the active state when a transmitter prepares to transmit an RF signal generated as a function of an NMR signal received by an MR detector coil that is operably connected to the transmitter. In one example, the tuning logic is to automatically enter the active state when the system is powered up.

Method 600 may also include, at 620, controlling the tuning logic to configure the transmitter with respect to one or more of, frequency, amplitude, and phase based, at least in part, on a transmission parameter. In one example, the tuning logic is to receive a startup parameter when the system is powered up. The startup parameter determines one or more of the frequency, amplitude, and phase.

Method 600 may also include, at 630, controlling the transmitter to transmit the RF signal during a noise tolerant time period in which the MR detector coil is not expected to detect NMR signals. The noise tolerant time period may be, for example, a time period during which the object is not being subjected to RF and during which the object is not emitting NMR signals to be detected.

Method 600 may also include, at 640, controlling the tuning logic to enter a passive state after the RF signal has been transmitted. The tuning logic may remain in the passive state during a noise intolerant time period in which the MR detector coil is expected to detect NMR signals. Thus, the transmitter and the circuitry controlling the transmitter will not produce RF that will interfere with receiving NMR signals. Since even clocking signals may generate unacceptable RF noise, controlling the tuning logic to enter the passive state may include controlling the tuning logic to power off. In this example, controlling the tuning logic to enter an active state may include controlling the tuning logic to power on. Since the tuning logic may power off and on, a non-volatile memory may store a program to control the tuning logic. This program may receive a startup parameter from which transmission properties can be determined.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. An apparatus, comprising:
   a magnetic resonance imaging (MRI) detector coil configured to receive a nuclear magnetic resonance (NMR) signal from an object subjected to radio frequency (RF) energy applied by an MRI apparatus according to an MRI pulse sequence;
   one or more dynamically configurable transmitters to transmit an RF transmission to the MRI apparatus according to a configurable set of transmission parameters, the RF transmission being based, at least in part, on the NMR signal received by the MRI detector coil; and
   a tuning logic configured to enter an active state and a passive state under the control of a tuning program, where the tuning logic, when in the passive state, is to generate substantially no RF that could interfere with receiving the NMR signal at the MRI detector coil, and where the tuning logic, when in the active state, is to configure the one or more dynamically configurable transmitters to transmit according to the set of transmission parameters.

2. The apparatus of claim 1, where the apparatus is wirelessly connected to the MRI apparatus.

3. The apparatus of claim 1, comprising a non-volatile memory to store the tuning program.

4. The apparatus of claim 3, where the tuning logic is configured to enter the passive state before the NMR signal is received by the MRI detector coil.

5. The apparatus of claim 4, where the tuning logic is configured to enter the active state after the NMR signal is received by the MRI detector coil.

6. The apparatus of claim 1, where the set of transmission parameters includes one or more of, frequency, amplitude, and power.

7. The apparatus of claim 1, where values for members of the set of transmission parameters are selected based, at least in part, on a startup parameter provided to the apparatus.

8. The apparatus of claim 7, where the startup parameter is based, at least in part, on a time interval between a circuit operably connected to the apparatus being powered on and the circuit achieving a threshold voltage.

9. The apparatus of claim 7, where the startup parameter is provided by an external circuit operably connected to the apparatus.

10. The apparatus of claim 1, where the tuning program is configured as a function of the MRI pulse sequence.

11. The apparatus of claim 1, where the tuning logic is one of, a microprocessor, and a microcontroller.

12. The apparatus of claim 1, where the tuning logic is programmed through one or more of, direct in-circuit programming, component-based analog programming, component-based digital programming, and wireless programming.

13. The apparatus of claim 1, where the tuning logic is configured to control one or more of, carrier frequency synthesis for the transmitter, carrier frequency power output of the transmitter, apparatus power consumption, battery management for the apparatus, and channel synchronization for the transmitter.

14. The apparatus of claim 1, where the tuning logic is configured to control a digital device that controls the frequency at which the transmitter is to transmit.

15. The apparatus of claim 1, the tuning logic comprising:
a microcontroller operably connected to the transmitter, where the microcontroller controls a phased lock loop circuit to generate a desired control frequency and where the phased locked loop circuit controls the transmitter to transmit at a desired transmission frequency as a function of the control frequency.

16. The apparatus of claim 1, where the passive state is a power-off state and where the active state is a power-on state.

17. A system, comprising:
a set of N related detector coil transmitters, N being an integer greater than 1, where a detector coil transmitter comprises:
a magnetic resonance imaging (MRI) detector coil configured to receive a nuclear magnetic resonance (NMR) signal from an object subjected to radio frequency (RF) energy applied by an MRI apparatus according to an MRI pulse sequence;
a dynamically configurable transmitter to transmit an RF transmission to the MRI apparatus according to a configurable set of transmission parameters, the RF transmission being based, at least in part, on the NMR signal received by the MRI detector coil; and
a tuning logic configured to enter an active state and a passive state under the control of a tuning program, where the tuning program is configured as a function of the MRI pulse sequence,
where the tuning logic, when in the passive state, is to generate substantially no RF that could interfere with receiving the NMR signal at the MRI detector coil, and
where the tuning logic, when in the active state, is to configure the dynamically configurable transmitter to transmit according to the set of transmission parameters,
where at least two members of the set of N related detector coil transmitters receive NMR signal from the object and transmit RF to the MRI apparatus in response to receiving NMR signal, where the at least two members of the set of N related detector coil transmitters transmit RF at different frequencies.

18. The system of claim 17, where a first tuning logic is to configure a first transmitter associated with a first MRI coil to transmit at a first frequency in accordance with a control program as configured by a first startup parameter and where a second tuning logic is to configure a second transmitter associated with a second MRI coil to transmit at a second frequency in accordance with the control program as configured by a second startup parameter.

19. The system of claim 18, where a first non-volatile memory stores the control program and provides instructions to the first tuning logic and where a second non-volatile memory stores the control program and provides instructions to the second tuning logic.

20. A magnetic resonance imaging (MRI) apparatus, comprising:
an MRI scanner;
a broadband RF receiver; and
a set of detector coil transmitter apparatus that are not physically connected to either the MRI scanner or the broadband RF receiver,
where a detector coil transmitter apparatus comprises:
a magnetic resonance imaging (MRI) detector coil configured to receive a nuclear magnetic resonance (NMR) signal from an object subjected to radio frequency (RF) energy applied by the MRI scanner according to an MRI pulse sequence;
a dynamically configurable transmitter to transmit an RF transmission to the broadband RF receiver according to a configurable set of transmission parameters, the RF transmission being based, at least in part, on the NMR signal received by the MRI detector coil; and
a tuning logic configured to enter an active state and a passive state under the control of a tuning program,
where the tuning logic, when in the passive state, is to generate substantially no RF that could interfere with receiving the NMR signal at the MRI detector coil, and
where the tuning logic, when in the active state, is to configure the dynamically configurable transmitter to transmit according to the set of transmission parameters.

21. The MRI apparatus of claim 20, comprising:
a decoder logic operably connected to the broadband receiver and configured to decode the RF transmission into a signal from which the MRI apparatus is to create an image related to the NMR signal detected at the detector coil.

22. A system, comprising:
means for controlling a tuning logic to enter an active state based, at least in part, on a transmitter preparing to transmit an RF signal generated as a function of an NMR signal received by an MR detector coil that is operably connected to the transmitter;
means for controlling the tuning logic to configure the transmitter with respect to one or more of, frequency, amplitude, and phase based, at least in part, on a transmission parameter;
means for controlling the transmitter to transmit the RF signal during a noise tolerant time period in which the MR detector coil is not expected to detect NMR signals; and
means for controlling the tuning logic to enter a passive state after the NMR signal has been detected, where the tuning logic will remain in the passive state during a noise intolerant time period in which the MR detector coil is expected to detect NMR signals.

23. The system of claim 22, where the tuning logic is to enter the active state when the system is powered up.

24. The system of claim 23, where the tuning logic is to receive a startup parameter when the system is powered up, and where the startup parameter determines one or more of the frequency, amplitude, and phase.

* * * * *